Figure 1:
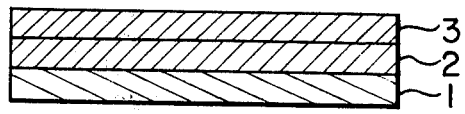

United States Patent [19]

Hayashi et al.

[11] 4,035,189
[45] July 12, 1977

[54] IMAGE FORMING CURABLE RESIN COMPOSITIONS

[75] Inventors: Nobuyuki Hayashi; Asao Isobe; Katsushige Tsukada; Ken Ogawa; Masahiro Abo, all of Hitachi, Japan

[73] Assignee: Hitachi Chemical Company, Ltd., Japan

[21] Appl. No.: 594,870

[22] Filed: July 10, 1975

Related U.S. Application Data

[63] Continuation of Ser. No. 335,313, Feb. 23, 1973, abandoned.

[30] Foreign Application Priority Data

Feb. 25, 1972 Japan .................................. 47-18940
Mar. 6, 1972 Japan .................................. 47-22252

[51] Int. Cl.² ............................ G03C 1/68; C08F 8/18
[52] U.S. Cl. .................................. 96/115 R; 96/115 P; 96/35.1; 96/87 R; 204/159.18; 204/159.19; 204/159.23
[58] Field of Search ............ 96/115 R, 115 P, 35.1, 96/97 R; 204/159.18, 159.19, 159.23

[56] References Cited

U.S. PATENT DOCUMENTS

| | | | |
|---|---|---|---|
| 3,074,869 | 1/1963 | Workman | 96/35.1 |
| 3,776,729 | 12/1973 | Levy | 96/35.1 |
| 3,895,952 | 7/1975 | Schlesinger | 96/115 R |
| 3,926,636 | 12/1975 | Barzynski et al. | 96/115 R |

*Primary Examiner*—Jack P. Brammer
*Attorney, Agent, or Firm*—Craig & Antonelli

[57] ABSTRACT

A resist image, which is excellent in adhesiveness and high in physicochemical strengths, can be obtained by using as a resist material a resin composition having such properties that when it is exposed to actinic rays, a latent image (cure-precursor) is formed therein, and when it is subjected to subsequent heating, only the latent image portion is selectively cured.

An example of the above-mentioned resin composition is a latently curable epoxy resin composition composed essentially of (A) an epoxy resin prepolymer and (B) a compound having in the molecule at least two groups represented by the formulas (I) and/or (II),

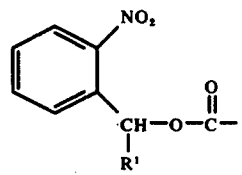 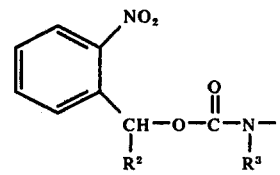

(I)             (II)

wherein $R^1$, $R^2$ and $R^3$ are individually a hydrogen atom, an alkyl group or aryl group.

Another example of the resin composition is a curable resin composition composed mainly of photopolymerization sensitizers and N-methylolacrylamide derivatives represented by the formula,

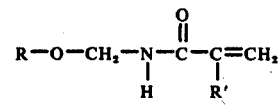

wherein R is a hydrogen atom or a substituted or unsubstituted alkyl group having 1 to 4 carbon atoms; and R' is a hydrogen atom or a methyl group.

11 Claims, 1 Drawing Figure

IMAGE FORMING CURABLE RESIN COMPOSITIONS

This application is a continuation of application Ser. No. 335,313 filed Feb. 23, 1973, now abandoned.

This invention relates to a resist image formation process, and to resin compositions and laminates for use in said process.

Heretofore, many proposals have been made with respect to resist materials to be used for the preparation of printed circuit plates, etc. These resist materials are composed of photosensitive substances and become liquid-insoluble upon exposure to actinic rays. Examples of such resist materials include those of the bichromate type and the polyvinyl cinnamate type. These resist materials are ordinarily sold in the form of solutions. In application, they are coated on resist image-forming base sheets and then dried. However, the coating and drying operations have required high techniques to bring about great inconvenience for users of said resist materials.

As a substitute for the above-mentioned solution type resist material, a film-like resist material has come to be spread in recent years. In application, the film-like resist material which has been dried may be merely laminated on an image-forming base sheet, so that there arises no such trouble as encountered in using the conventional solution type resist material. However, it is known that the above-mentioned new procedure and resist material are to be greatly improved in several points. One of these points is the adhesion of the resist material to the image-forming base sheet. The material used at present in the film process is a film-like material formed by merely removing the solvent from an ordinary solution type resist material, and hence is necessarily poor in adhesion to base sheet as compared with the case where the coating of resist material is carried out in the presence of solvents. Due to such insufficient adhesion, there is brought about the phenomenon that the resist is peeled off at the time of development, etching or plating which phenomenon gives great damage to users of resist materials. Concerning this point, there has been proposed such a procedure that the resist material applied to a base sheet is heated before exposure to actinic rays. According to the examination conducted by the present inventors, however, it has been found that said procedure does not result in any sufficient improvement. On the other hand, if the actinic ray exposure is carried out over a long period of time, another undesirable phenomenon is brought about due to excess exposure, though the resist material is slightly improved in adhesion to base sheet. That is, even a portion to be removed by development is also photocured, and the resulting image does not accurately reproduce the mask and is deteriorated in resolution. Further, there is brought about such problem that the costs are increased due to extension of operation time.

The second point that is strongly desired to be improved at present, in addition to the adhesiveness, is concerned with the physical properties of resist materials. Photosensitive substances which have been used hitherto, including photopolymerizable resins used exclusively in film-like resist materials, are extremely low in physicochemical strengths, and various restrictions have been imposed to users of resist materials. For example, they can be subjected to treatment under neutral or acidic conditions, but cannot be subjected to treatment under alkaline conditions, e.g. ordinary non-electrolytic copper plating treatment. Further, they are not sufficient in mechanical strengths, and the users are afflicted with the formation of cracks due to mechanical impacts during various operations. In addition, the resist materials available at present are not usable in the cases where resist materials are subjected to etching, plating or the like treatment and then used as they are, without stripping them off, for the permanent protection of resist-coated portions.

In view of such actual state as mentioned above, the present inventors made extensive studies to accomplish the present invention, which is novel and useful.

An object of the present invention is to provide a process for forming resist image excellent in adhesiveness and high in physicochemical strengths.

Another object of the invention is to provide materials for use in the said process.

In accordance with the present invention, there is provided a process for forming a resist image, characterized in that a laminate composed of a support film and a resin composition layer, which has such properties that when it is exposed to actinic rays, a latent image (cure-precursor image) is formed therein, and when it is subjected to subsequent heating, only the latent image portion is selectively cured, is laminated on the surface of an image-forming solid, after removing a protective film, if any, from the surface of the laminate; the resin composition layer is exposed imagewise to actinic rays, after removing the support film if it is opaque to the actinic rays, to form a latent image in the resin composition layer; the whole surface of the resin composition layer is heated to selectively cure only the said latent image portion; and the uncured portion is removed by use of a liquid, after removing the transparent film if it has been left unremoved, thereby forming a resist image on the surface of said image-forming solid. The present image is characterized in that the curing of the resin composition layer for formation of resist image is carried out by adoption of the combination of actinic ray exposure and heating. Accordingly, the objects of the present invention can be accomplished by adoption of the combination of actinic ray exposure and heating, unlike in the prior art process in which curing has been conducted by adoption of only actinic ray exposure. Thus, the present invention brings about a great improvement in the settlement of problems in the prior art, which has never been expected hitherto. The heating adopted in the present invention is not the high temperature treatment (ordinarily at about 200° C) carried out after development which is called "burning", but is a heat treatment conducted before development. By said heating, only the portion exposed to actinic rays is selectively cured.

The laminate used in the present invention is diagrammatically shown in the FIGURE attached hereto, in which 1 is a support film, 2 is a resin composition layer, and 3 is a protective film.

A preferable support film is selected from such a wide scope of substances as papers, woven fabrics, and films of polyamides, polyolefins, polyesters, vinyl polymers, cellulose esters and the like high polymers. A particularly preferable support film is a polyethylene terephthalate film. This film is excellent in resistance to solvent and heat, and hence is suitable for preparation of the laminate. Further, the film is actinic ray-permeable and is low in oxygen permeability, and hence is preferable in that at the time of actinic ray exposure, it is not required to be peeled off but can be used as it is after placing a mask thereon. The use of said film is particularly preferable in the case of a photopolymerization system using a resin composition layer which is oxygen-desensitizing. However, in case there is used a resin composition layer which is not oxygen-desensitizing, the presence of the support film is not required at the time of exposure. In the present invention, a support film having a thickness of 4 to 50 μ is ordinarily used.

The resin composition layer (2) used in the present invention has a thickness of 3 to 250 μ, preferably 10 to 80 μ, and is composed of such a resin composition that when it is heated after exposure to actinic rays, only the portion exposed to actinic rays is selectively cured to a liquid-insoluble state. That is, when the layer is exposed to actinic rays, a latent image (cure-precursor image) is formed in the layer, and when the layer is subsequently heated, the thus formed latent image portion is cured. The term "cure-precursor" referred to herein signifies a compound, which is formed by exposing the resin composition layer to actinic rays and which, when examined as it is (i.e. prior to heating) does not substantially differ in liquid solubility from other portion (i.e. unexposed portion), or is not clearly different in liquid solubility. For example, therefore, a carboxylic acid compound, an amine compound or a linear polymer, which is formed due to actinic ray exposure, corresponds to the cure-precursor referred to herein. The above explanation will become clearer from the examples of resin composition shown below.

An example of the resin composition is a latently curable epoxy resin composition composed essentially of (A) an epoxy resin prepolymer and (B) a compound having in the molecule at least two groups represented by the formulas (I) and/or (II).

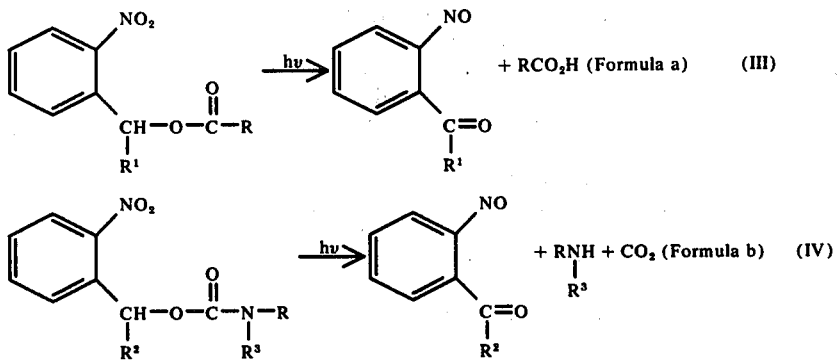

wherein $R^1$, $R^2$ and $R^3$ are individually a hydrogen atom, an alkyl group or an aryl group.

It is well known that when irradiated with light, compounds represented by the formulas (III) and (IV) shown below give carboxylic acids and amines, respectively (refer to the formulas a and b).

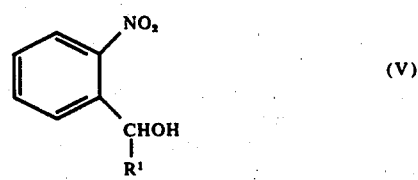

(wherein $R^1$, $R^2$ and $R^3$ are as defined previously). Thus, the compounds are irradiated with light to form carboxyl and amino groups, and then heated to three dimensionally cure the resin prepolymers due to the existence of said groups. Accordingly, the carboxylic acid and/or amine formed by irradiation of light in the above case is the aforesaid cure-precursor.

The introduction of the groups represented by the formula (I) and (II) is easy. That is, the group of the formula (I) is obtained by the reaction of a carboxyl group, a carboxylic anhydride group or an acid halide group with an alcohol represented by the formula (V),

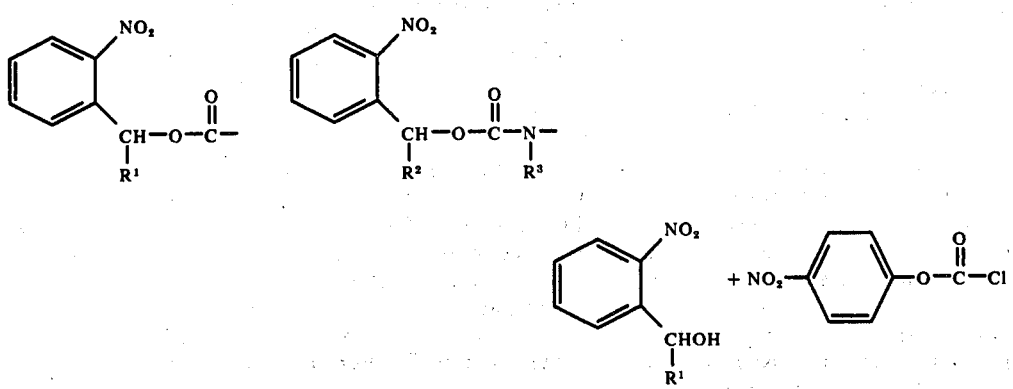

wherein $R^1$ is as defined previously. On the other hand, the group of the formula (II) is obtained by the reaction of an isocyanate group with an alcohol of the formula (V), or by the reaction according to the scheme of the following formulas (c) and (d):

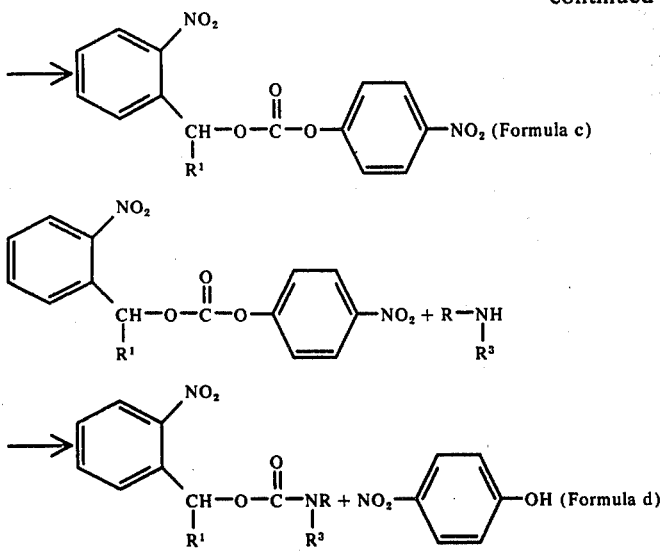

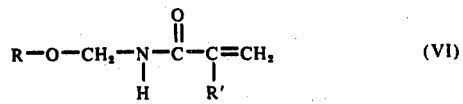

The compound having in the molecule at least two groups of the formulas (I) and/or (II) is synthesized by use of a polybasic carboxylic acid derivative, a polyfunctional amine derivative or a polyfunctional isocyanate derivative. For example, a compound having groups of the formula (I) at the two terminals is obtained by the reaction of adipic acid chloride with an alcohol of the formula (V), and a compound having groups of the formula (II) at the two terminals is obtained by the reaction of hexamethylene diisocyanate with an alcohol of the formula (V). Alternatively, a compound having many groups of the formula (I) in the molecule is obtained by polymerizing an acrylic acid ester formed by the reaction of acrylic acid chloride with an alcohol of the formula (V).

Epoxy resin prepolymers usable in the present invention are compounds having at least two epoxy groups in a molecule, and include epichlorohydrin-bisphenol A condensates, polyolefin epoxides, novolak type epoxy resins and high polymers from glycidyl esters of unsaturated acids. These epoxy resin prepolymers are three-dimensionally cured smoothly by heating together with carboxyl and amino groups formed by irradiation with light of compounds having in the molecule at least two groups of the formulas (I) and/or (II).

Under ordinary conditions, the formation of carboxyl and amino groups by irradiation with light of compounds having groups of the formulas (I) and (II) proceeds with high efficiency and may be considered substantially quantitative, though the amounts of the groups formed vary depending on the kind and intensity of the light source used. Accordingly, the blending ratio of the compound having groups of the formulas (I) and (II) to the epoxy resin prepolymer and the curing condition after irradiation of light may be selected with the same consideration as in the case where a polyfunctional carboxylic acid or amine compound and a corresponding ordinary epoxy resin are used. Ordinarily, the compound is blended with the epoxy resin prepolymer in such a proportion that the total amount of the groups of the formula (I) and/or (II) becomes 0.1 to 0.8 equivalent, preferably 0.3 to 0.7 equivalent, based on the amount of the epoxy group in the epoxy resin prepolymer.

The resin composition may contain various fillers, additives, pigments, dyes, etc. as subsidiary components. In view of the photosensitivity of the composition, it is necessary to make more or less restrictions with respect to the light permeability thereof. It is preferable to use a synthetic high polymer and a plasticizer in order to control film property of the composition.

Another example of the resin composition used in the present invention is a curable resin composition composed mainly of photopolymerization sensitizers and N-methylolacrylamide derivatives represented by the formula (VI), $$R-O-CH_2-\underset{\underset{H}{|}}{N}-\underset{}{\overset{\overset{O}{\|}}{C}}-\underset{\underset{R'}{|}}{C}=CH_2 \quad (VI)$$

wherein R is a hydrogen atom or a substituted or unsubstituted alkyl group having 1 to 4 carbon atoms; and R' is a hydrogen atom or a methyl group. The above-mentioned N-methylolacrylamide derivatives have such properties that when they are exposed to actinic rays in the presence of photopolymerization sensitizers, the vinyl groups in the molecules polymerize, and when they are heated, the methyl ether groups bring about condensation reactions. Accordingly, the composition is exposed to actinic rays to form a polymer image as a latent image (cure-precursor image), and is then heated to cure by condensation only the polymer image portion, i.e. the cure-precursor image portion. Examples of the N-methylolacrylamide derivatives used in the present invention include N-methylolacrylamide, N-ethoxymethyl acrylamide, N-propoxymethyl acrylamide, N-butoxymethylacrylamide and methacrylamide homologues thereof. These may be used either singly or in the form of a mixture. The amount of the N-methylolacrylamide derivatives used is 10 to 80 % by weight based on the weight of the resin composition. The other essential component is photopolymerization sensitizers which initiate and promote the polymerization of vinyl groups when the composition is exposed to actinic rays. Examples of the sensitizer include anthraquinone type compounds such as t-butyl anthraquinone; acyloin type compounds such as benzoin and alkyl ether derivatives thereof; ketones such as benzophenone and Michler's ketone; and diketones such as diacetyl. These may be used either singly or in the form of a mixture. The amount of the sensitizer used is 0.1 to 50 % by weight, preferably 0.5 to 20 % by weight, based on the weight of the resin composition. Other subsidiary components to be added to the resin composition include thermal polymerization inhibitors, binders and plasticizers for impartment and control of film properties, dyes and pigments.

The resin composition layer 2 is formed by coating a solution of the above-mentioned composition on the support film 1, followed by drying. The protective film 3 is laminated on the thus formed resin composition layer 2. A preferable protective film is selected from the previously exemplified support films. A particularly preferable protective film is a polyethylene film which is frequently used in view of its cost and physical properties. The thickness of the protective film is ordinarily 4 to 50 $\mu$.

The resist image formation process of the present invention can be practiced with extreme ease without any high technique. The lamination onto the surface of an image-forming solid is carried out while removing the protective film. Ordinarily, there is adopted the procedure that the lamination is conducted under pressure by use of a hot roller at 40° to 150° C. It is preferable that prior to the lamination, the surface of the solid is cleaned or is subjected to pre-treatment to increase the adhesion thereof to the resin composition layer. Particularly, the pre-heating (ordinarily at 50° to 150° C.) of the solid surface gives favorable results. A heat treatment prior to actinic ray exposure after the lamination is not essential but sometimes brings about favorable results. The actinic ray exposure is ordinarily effected for a short period of time, though varies depending on the kind and intensity of the light source used and on the kind of the resin composition.

As the light source of actinic rays, there may be used any of low pressure mercury lamps, high pressure mercury lamps, ultra-high pressure mercury lamps, carbon arc lamps and xenon lamps. Particularly, high pressure mercury lamps and ultra-high pressure mercury lamps are preferable. Ordinarily, it suffices that a resin composition layer of 40 $\mu$ in thickness is exposed for 0.5 to 20 minutes to an ultra-high pressure or high pressure mercury lamp with an intensity of 5,000 $\mu$ W/cm² (at the irradiated surface). After exposure to actinic rays, the resin composition layer is subjected to heating without any treatment. The heating is conducted at a temperature of 25° to 250° C., preferably 60° to 200° C. Ordinarily, the heating is carried out for a period within 20 minutes. Subsequently, the resin composition layer is freed from the support film, if any, and is then subjected to development. The liquid to be used for the development is a compound capable of removing uncured portion of the resin composition layer, and is ordinarily a halogenated hydrocarbon compound. In case a water-soluble polymer, for example, has been used as the binder in the resin composition layer, there is employed an aqueous weakly alkaline solution or an alcohol.

After the development, the layer may further be subjected to heat treatment for reinforcement of the resulting image. The thus obtained resist image maintains sufficient strengths as a resist during etching, plating or the like treatment, does not cause any such detrimental phenomenon as peeling of resist, and thus is successfully used for the preparation of printed circuit plates, the production of offset printing plates, and the precise processing of metals.

The present invention is illustrated in detail below with reference to examples.

EXAMPLE 1

A. Preparation of laminate

A resin composition was prepared by use of the following compounds:

| | |
|---|---|
| Bis(o-nitrodiphenylmethyl) adipate | 5.68 parts by weight |
| Epoxy resin Epicote 828 produced by Shell Co. | 40.00 parts by weight |
| Phenoxy resin PKHH produced by Union Carbide Co. | 60.00 parts by weight |
| Chloroform | 20.00 parts by weight |

The thus prepared resin composition was coated on a polyethylene terephthalate film of 25$\mu$ in thickness, and was then dried to form a resin composition layer having a thickness of 30 $\mu$. Subsequently, a polyethylene film of 30$\mu$ in thickness was laminated as a protective film on said resin composition layer to prepare a laminate.

B. Formation of resist image

A copper foil-coated laminate sheet was cleaned according to an ordinary procedure. On the copper foil of said sheet, the resin composition layer of the laminate prepared in (A) was laminated by use of two rolls heated to 100° C., while peeling off the polyethylene film from the laminate. The resulting laminate was exposed for 3 minutes through a mask to a 3 KW ultra-high pressure mercury lamp positioned at a distance of 70 cm from the laminate. Immediately thereafter, the laminate was heated at 160° C. for 5 minutes, allowed to cool to room temperature, and then developed by use of a 1:1 mixed solution of trichlene (1,1,2-trichloroethylene)-Chlorocence-(1,1,1-trichloroethane) to obtain a precise resist image corresponding to the mask. The thus obtained resist image could successfully withstand etching according to an ordinary procedure and subsequent gold plating. Further, the resist image caused no swelling, cracking, etc. even when immersed for 10 hours in an aqueous sodium hydroxide solution (pH 12) at 60° C. Thus, it was clarified that the resist image can successfully be used as a resist even in an alkaline metal-treating agent.

EXAMPLE 2

A. Preparation of laminate

A resin composition was prepared by use of the following compounds:

| | |
|---|---|
| N,N'-Bis(o-nitrodiphenylmethyloxycarbonyl) hexamethylenediamine (Formula VII shown below) | 16.00 parts by weight |
| Epoxy resin Epicote 828 produced by Shell Co. | 20.00 parts by weight |
| Phenoxy resin PKHH produced by Union Carbide Co. | 20.00 parts by weight |
| Chloroform | 150.00 parts by weight |

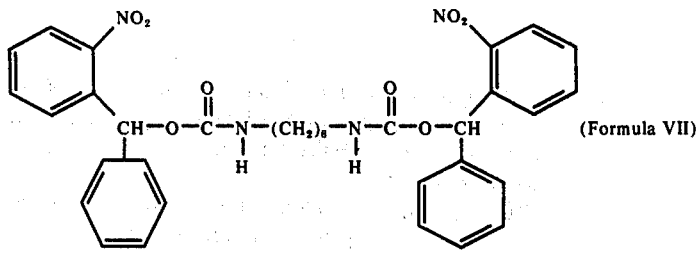

(Formula VII)

Subsequently, the resin composition was treated in the same manner as in Example 1 to prepare a laminate.

B. Formation of resist image

The laminate prepared in (A) was treated in the same manner as in Example 1, whereby a precise resist image corresponding to the mask was obtained on the copper foil-coated laminate sheet.

EXAMPLE 3

A mixture comprising 5.0 g. of o-nitrobenzyl acrylate, 3.0 g. of glycidyl methacrylate, 10.0 g. of methyl methacrylate, 0.2 g. of azobisisobutyronitrile and 40 ml. of methyl ethyl ketone was polymerized at 75° C. for 12 hours to obtain 14.0 g. of a copolymer. The thus obtained copolymer was dissolved in benzene, and the resulting solution was coated on two aluminum sheets having clean surfaces and then dried at 80° C. for 20 minutes to prepare two films of 50$\mu$ in thickness. One of the two films was exposed for 5 minutes to a 3 KW ultra-high pressure mercury lamp with an intensity of 5,000 $\mu$W/cm² (at the exposed surface), and the other film was left unexposed. 3 Grams of each of the exposed and unexposed films was taken up and was measured in gelation characteristic on a hot plate. As the result, the exposed film gelled when heated for 180 seconds at 140° C., whereas the unexposed film did not gel even when heated for 1 hour at 140° C.

Using the aforesaid benzene solution of copolymer, a laminate comprising a polyethylene film, a resin composition layer of 30 $\mu$ in thickness and a polyethylene terephthalate film was prepared in the same manner as in Example 1. The thus prepared laminate was laminated on a copper foil-coated laminate, exposed for 5 minutes through a mask, thermally treated at 140° C. for 10 minutes and then developed in the same manner as in Example 1 to obtain a precise resist image corresponding to the mask which had a resolution of 12.5 lines/mm and showed a Kodak step tablet number of 7. The thus obtained resist image was excellent in resist characteristics, like the resist image obtained in Example 1.

EXAMPLE 4

A resin composition was prepared by use of the following compounds:

| | |
|---|---|
| Methyl o-nitrodiphenyl adipate | 5.68 parts by weight |
| Methyl methacrylate-glycidyl methacrylate-n-butyl methacrylate copolymer (70 : 10 : 20 by weight ratio) | 30.00 parts by weight |
| Methyl ethyl ketone | 70.00 parts by weight |

The thus prepared resin composition was treated in the same manner as in Example 1, whereby a precise image corresponding to the mask was formed on the copper coil-coated laminate sheet.

EXAMPLE 5

A. Preparation of laminate

A resin composition was prepared by use of the following compounds:

| | |
|---|---|
| Polymethyl methacrylate | 60 parts by weight |
| N-n-Butoxymethyl acrylamide | 35 parts by weight |
| Benzoin methyl ether | 2 parts by weight |
| Hydroquinone | 0.2 parts by weight |
| Methyl ethyl ketone | 100 parts by weight |

The thus prepared resin composition was coated on a polyethylene terephthalate film of 25$\mu$ in thickness, and was then dried at 70° C. to form a resin composition layer having a thickness of 30 $\mu$. Subsequently, a polyethylene film of 30$\mu$ in thickness was laminated as a protective film on said resin composition layer to prepare a laminate.

B. Formation of resist image

A copper foil-coated laminate sheet was cleaned according to an ordinary procedure. On the copper foil of said sheet, the resin composition layer of the laminate prepared in (A was laminated by use of two rolls heated to 100° C., while peeling off the polyethylene film from the laminate. The resulting laminate was exposed for 50 seconds through Kodak Step Tablet No. 2 and a resolution chart to a 3 KW ultra-high pressure mercury lamp positioned at a distance of 70 cm from the laminate. Immediately thereafter, the laminate was heated at 140° C. for 3 minutes, allowed to cool to room temperature, and then developed by use of Chlorocene (trade name for 1,1,1-trichloroethane) to obtain a resist image which had a step tablet number of 9 and showed a resolution of 15 lines/mm. The thus obtained resist image could successfully withstand etching according to an ordinary procedure and subsequent gold plating.

For comparison, a resist image was obtained in the same manner as above, except that the heat treatment was not effected. The thus obtained resist image had a step tablet number of 2 and a resolution of 2 lines/mm (provided that the lines were not clear).

For further comparison, a resist image was obtained in the same manner as above, except that the heat treatment was not effected and the actinic ray exposure was conducted for 3 minutes. The thus obtained resist image had a step tablet number of 4, but the resolution thereof could not be measured by means of the resolution chart used, and was found to be less than 2 lines/mm. It was found that in this case, even a portion, which should not be cured, had been cured due to excess exposure.

EXAMPLE 6

Example 1 was repeated, except that the resin composition was prepared by use of the following compounds:

| | |
|---|---|
| Methyl methacrylate-acrylonitrile copolymer (10 : 1 by weight ratio) | 60 parts by weight |
| N-Methylolacrylamide | 30 parts by weight |
| Trimethylol propane triacrylate | 5 parts by weight |
| t-Butyl anthraquinone | 5 parts by weight |
| p-Methoxyphenol | 0.2 parts by weight |

As the result, an excellent resist image was obtained.

EXAMPLE 7

Example 5 was repeated, except that compounds, which had been obtained by reacting N-methylolacrylamide with each of ethylene glycol and cellosolve acetate in the presence of an acid catalyst, were individually used in place of the N-n-butoxymethyl acrylamide, whereby excellent resist images were obtained. Thus, it was clarified that the above-mentioned compounds can also be used, like N-n-butoxymethyl acrylamide, for the preparation of resin compositions suitable for use in the present invention.

As is clear from the above examples, a resist image can simply be formed according to the process of the present invention, and the thus formed resist image has firmly adhered onto the surface of an image-forming solid, sufficiently acts as a resist in such treatments as etching, plating, etc., and is useful for the production of printed circuit plates, the precise processing of metals and the preparation of offset printing plates. Particularly, the epoxy resin composition used in the present invention is excellent in alkali resistance, and hence is useful also as a resist material capable of being subjected to metal treatment, in which the known film-like resist material has not been used.

What is claimed is:

1. A resist image-forming curable resin composition which comprises (A) an epoxy resin prepolymer having at least two epoxy groups per molecule and (B) a compound having in the molecule at least two groups represented by formulas (I) and/or (II),

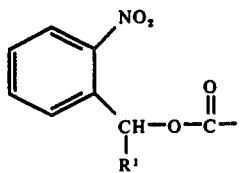 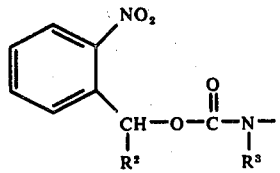

(I)      (II)

wherein $R^1$, $R^2$ and $R^3$ are individually a hydrogen atom, an alkyl group or an aryl group, said compound (B) being:

a. a compound produced by the reaction of a polycarboxylic acid, polycarboxylic acid anhydride, polycarboxylic acid halide, polyamine or polyisocyanate with an alcohol represented by the formula (V):

(V)

b. a compound produced by polymerization of an ester of a monomeric ethylenically-unsaturated acid or an acid anhydride thereof and an alcohol of the formula (V):

the ratio of said compound (B) to said epoxy resin prepolymer (A) being in the range 0.1 to 0.8 where said range is defined by the ratio of the sum of said groups (I) and/or (II) in compound (B) expressed in equivalents to the sum of said epoxy groups in compound (A).

2. A composition according to claim 1 wherein said epoxy resin prepolymer is an epichlorohydrin-bisphenol A condensate, polyolefin oxide, a novolak type epoxy resin, or a high polymer from glycidyl esters of unsaturated acids.

3. A composition according to claim 2 wherein said epoxy resin prepolymer is an epichlorohydrin-bisphenol A condensate.

4. A composition according to claim 2 wherein said epoxy resin prepolymer is a novolak type epoxy resin.

5. A composition according to claim 2 wherein said epoxy resin prepolymer is a polyolefin oxide.

6. A composition according to claim 2 wherein said epoxy resin prepolymer is a high polymer from glycidyl esters of unsaturated acids.

7. A composition according to claim 1 wherein said polycarboxylic acid halide is adipyl chloride.

8. A composition according to claim 1 wherein said polyisocyanate is hexamethylene diisocyanate.

9. A composition according to claim 1 wherein aid ester is o-nitrobenzylacrylate.

10. A composition according to claim 1 wherein said compound (B) is bis(o-nitrodiphenylmethyl)adipate having the structure

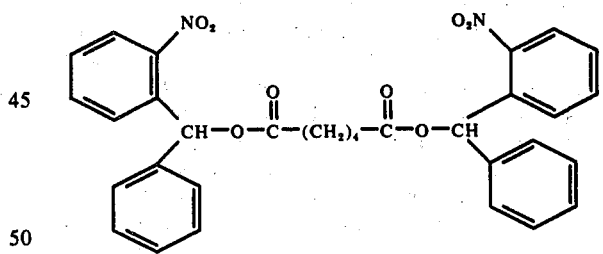

11. A composition according to claim 1 wherein said compound (B) is N,N'-bis(o-nitrodiphenylmethyloxycarbonyl) hexamethylenediamine having the structure

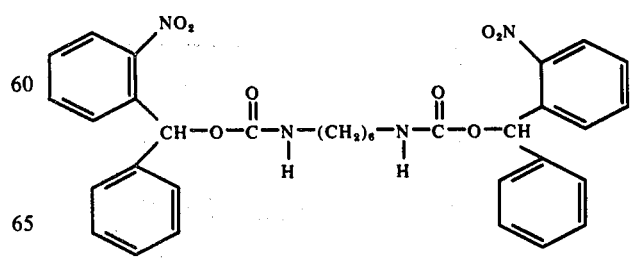

* * * * *